(12) United States Patent
Murasawa et al.

(10) Patent No.: US 8,130,805 B2
(45) Date of Patent: Mar. 6, 2012

(54) SEMICONDUCTOR LASER APPARATUS

(75) Inventors: Satoshi Murasawa, Hyogo (JP); Toru Takayama, Hyogo (JP); Yoshiaki Hasegawa, Okayama (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 12/706,636

(22) Filed: Feb. 16, 2010

(65) Prior Publication Data

US 2010/0296542 A1 Nov. 25, 2010

(30) Foreign Application Priority Data

May 19, 2009 (JP) ................................. 2009-120806

(51) Int. Cl.
*H01S 5/00* (2006.01)
(52) U.S. Cl. ......... 372/46.014; 372/46.015; 372/46.011; 372/46.01
(58) Field of Classification Search ............. 372/46.014, 372/46.011, 46.01
See application file for complete search history.

(56) References Cited

U.S. PATENT DOCUMENTS

| | | | |
|---|---|---|---|
| 2003/0169796 A1 | 9/2003 | Nakamura et al. | |
| 2003/0210721 A1 | 11/2003 | Haneda et al. | |
| 2003/0231685 A1 | 12/2003 | Nakamura et al. | |
| 2005/0201440 A1 | 9/2005 | Asano | |
| 2006/0109881 A1 | 5/2006 | Kwak et al. | |
| 2006/0239318 A1 * | 10/2006 | Kunimasa | 372/36 |

FOREIGN PATENT DOCUMENTS

| | | |
|---|---|---|
| JP | 2007-311682 | 11/2007 |
| JP | 2007-329487 | 12/2007 |
| JP | 2009-004645 | 1/2009 |

* cited by examiner

*Primary Examiner* — Kinam Park
(74) *Attorney, Agent, or Firm* — McDermott Will & Emery LLP

(57) ABSTRACT

A semiconductor laser apparatus includes, on a substrate, a first-conductivity type layer, an active layer, a second-conductivity type layer having a ridge extending along an optical waveguide direction, and a current blocking layer formed on sides of the ridge. The ridge is disposed to separate the substrate into a first region having a first width, and a second region having a second width greater than the first width, in a direction perpendicular to the optical waveguide direction. The second-conductivity type layer has a shock attenuating portion having a height greater than or equal to that of the ridge, on sides of the ridge. In the second region, a trench extending from an upper surface of the shock attenuating portion, penetrating at least the active layer, and reaching the first-conductivity type layer, is formed along the optical waveguide direction.

11 Claims, 9 Drawing Sheets

SEMICONDUCTOR LASER APPARATUS

CROSS-REFERENCE TO RELATED APPLICATION

This application claims priority to Japanese Patent Application No. 2009-120806 filed on May 19, 2009, the disclosure of which including the specification, the drawings, and the claims is hereby incorporated by reference in its entirety.

BACKGROUND

The present disclosure relates to semiconductor laser apparatuses, and more particularly, to semiconductor laser devices for which a reduction in chip area is required.

In recent years, semiconductor laser devices are used as a light source for most optical pickups which are used in optical recording apparatuses, optical reading apparatuses and the like for recording media, such as optical disks, magneto-optical recording disks and the like. Their applications cover a variety of products, such as recorders, PCs, cars and the like. The optical disk market is expanding steadily. In particular, recently, the market for the next-generation DVD (Blu-ray), which requires gallium nitride-based semiconductor (AlGaInN) laser devices which employ a blue-violet light emission wavelength, has rapidly spread and is becoming pervasive. Under such a circumstance, a reduction in cost of a blue-violet laser as the light source is crucial in accelerating the penetration of the next-generation DVD.

The cost reduction may be achieved by, for example, reducing a size (chip area) of a laser chip. For example, when a laser chip has a length of 1000 μm and a width of 300 μm, then if the width of the laser chip can be reduced by half (length: 1000 μm, width: 150 μm), the number of laser chips per wafer can be doubled, which significantly contributes to a reduction in manufacturing cost of the laser chip.

The reduction in laser chip area can reduce the cost, but is not limitless.

In laser chips, a stripe-like ridge for injecting a current is typically provided at a center in a transverse direction of the chip (see, for example, Japanese Patent Laid-Open Publication No. 2007-329487).

FIG. 8 is a cross-sectional view of a conventional semiconductor laser apparatus. As shown in FIG. 8, a ridge 605 is provided at a center of a laser chip 601. If the chip has a width of 200 μm, a distance X between the ridge 605 and each edge of the laser chip 601 is 100 μm. A current blocking layer 602 for confining a current is formed on the laser chip 601 on opposite sides of the ridge 605. Moreover, a positive electrode 603 is formed on the current blocking layer 602. On the other hand, a negative electrode 604 is formed on a lower surface of the laser chip 601. Moreover, a wire 606 for supplying a current is coupled to the positive electrode 603. The wire 606 can be disposed, avoiding the ridge 605 so that the bonding damage of the ridge 605 which serves as a path for supplying a current is reduced.

Incidentally, if the width of the chip of FIG. 8 is reduced to, for example, 150 μm, the ridge is disposed at a position of X=75 μm. Here, it is assumed that the wire has a diameter of 50±5 μm, overall variations during fabrication of a laser chip including the accuracy of positioning of a mask and the like (device fabrication process variations) fall within ±5 μm, overall variations during separation of a wafer into chips including the deviation of a cleavage position and the like (separation process variations) fall within ±10 μm, and the positional accuracy of wire bonding is ±10 μm. In this case, a tolerance (margin) of ±30 μm needs to be ensured at a position where the wire is provided. Therefore, the region where the wire is to be disposed needs to have a width of 50±30 μm for each chip, and therefore, if X=75 μm, there is a risk that the ridge will be damaged by wire bonding. The damaged ridge would lead to a reduction in light emission efficiency, resulting in a reduction in yield, a lack of long-term reliability, or the like.

Therefore, when the chip area is reduced, it is necessary to offset the ridge from the center of the chip to provide a structure which allows at least one of regions on the left and right sides of the ridge to provide a sufficient area for wire bonding so as to ensure a sufficient tolerance of the position of wire bonding. In other words, an asymmetric structure is required in which the regions on the left and right sides of the ridge have different widths.

SUMMARY

However, when the asymmetric structure in which the regions on the left and right sides of the ridge have different widths is employed, the following problem arises.

GaN-based semiconductor lasers typically include a cladding layer made of AlGaN and a substrate made of GaN. The difference in lattice constant between AlGaN and GaN is, for example, as large as about 0.24% when AlGaN is $Al_{0.1}Ga_{0.5}N$. Therefore, a large stress is induced in the semiconductor material of the active layer, the ridge or the like. The induced stress leads to a distortion of the crystal structure of the semiconductor material, resulting in a change in the refractive index.

FIG. 9A is a cross-sectional view schematically showing an example of the asymmetric structure in which the regions on the left and right sides of the ridge have different widths. FIG. 9B is an enlarged cross-sectional view of a vicinity of the ridge, accompanied by graphs showing a distribution of stresses applied to the vicinity of the ridge and a distribution of refractive indices of the vicinity of the ridge.

Firstly, as can be seen from the stress distribution of FIG. 9B, the stress changes to a greater degree on the left side of the center of the ridge than on the right side of the center of the ridge, i.e., the stresses on the left and right sides of the ridge are asymmetric. This is because the position of the ridge is offset to the left from the center position of the chip as shown in FIG. 9A. Specifically, the right side of the ridge is closer to the center of the chip and therefore has a smaller stress caused by the aforementioned lattice constant difference, while the left side of the ridge is farther from the center of the chip and therefore is affected by a stress caused by the lattice constant difference to a greater degree. The difference in stress between the regions on the left and right sides of the ridge affects the refractive index distributions in the regions on the left and right sides of the ridge. Specifically, the refractive index changes to a greater degree on the left side of the ridge than on the right side of the ridge, i.e., the refractive index distributions on the left and right sides of the ridge are asymmetric. The influence of the difference in refractive index alters the shape of the distribution of light propagating in the waveguide.

Such a phenomenon causes variations in the magnitude of the stress change among devices, resulting in a lack of a stable light distribution when the devices are mass-produced. Therefore, a problem arises, such as variations in the full width at half maximum of a Far-Field Pattern (FFP), an FFP having a bimodal shape, and the like, and therefore, a desired FFP having a unimodal shape cannot be achieved. Moreover, as the refractive indices differs between the left and right sides of the ridge, a direction having the largest light intensity in a FFP is deviated from a facet normal direction (deviation of the optical axis). The deviation of the optical axis causes a reduction in the light capturing efficiency of an optical pickup device, which leads to an increase in the light output or the amount of heat generated of the laser, resulting in a lack of long-term reliability.

Moreover, the asymmetry of the refractive index distributions in the regions on the left and right sides of the ridge causes the asymmetry of the light distributions on the left and right sides of the ridge. As a result, the active carrier density distributions of the active layer on the left and right sides of the ridge are also asymmetric, resulting in a reduction or variations in the nonlinearity (kink) of a light output with respect to a current, which leads to a reduction in yield.

In order to avoid the aforementioned problem, Japanese Patent Laid-Open Publication No. 2007-311682 describes a trench which is formed in the regions on the left and right sides of the ridge.

However, in the structure described in Japanese Patent Laid-Open Publication No. 2007-311682, although the ridge is formed in a semiconductor layer, no semiconductor layer having a height higher than or equal to that of the ridge is provided on both the sides of the ridge. In other words, a top portion of the ridge forms an uppermost surface of the chip described in Japanese Patent Laid-Open Publication No. 2007-311682. In such a case, when the laser chip is mounted on a submount, the ridge is likely to directly touch a collet for carrying the chip to a desired position, so that the ridge may be damaged during mounting of the laser chip, resulting in a lack of long-term reliability.

Moreover, in the structure described in Japanese Patent Laid-Open Publication No. 2007-311682, the trench is formed in a vicinity of the ridge by dry etching or the like. Therefore, for example, a portion of the active layer in a vicinity of the trench may be damaged by dry etching, i.e., a lattice defect is highly likely to occur in a vicinity of the trench. The lattice defect may be responsible for a leakage current, resulting in a reduction in reliability.

In view of the foregoing, the detailed description describes implementations of a semiconductor laser apparatus capable of preventing a degradation in characteristics and a reduction in reliability which are caused by a decrease in chip area.

An example semiconductor laser apparatus includes a substrate, a first-conductivity type layer formed on the substrate, an active layer formed on the first-conductivity type layer, a second-conductivity type layer formed on the active layer and having a ridge extending along an optical waveguide direction, and a current blocking layer formed on the second-conductivity type layer on sides of the ridge. The ridge is disposed to separate the substrate into a first region having a first width, and a second region having a second width greater than the first width, in a direction perpendicular to the optical waveguide direction. The second-conductivity type layer further has a shock attenuating portion having a height greater than or equal to that of the ridge, on sides of the ridge. In the second region, a trench extending from an upper surface of the shock attenuating portion, penetrating at least the active layer, and reaching the first-conductivity type layer, is formed along the optical waveguide direction. Here, the first width is a distance in the first region between a chip end and a center position of the ridge, and the second width is a distance in the second region between a chip end and the center position of the ridge.

According to the example semiconductor laser apparatus, even if the ridge is disposed so that regions on the left and right sides of the ridge are asymmetric in the direction perpendicular to the optical waveguide direction, i.e., a chip width direction, the trench reaching at least the first-conductivity type layer is formed in the second region having a greater width (a region having a greater distance between the center position of the ridge and a chip end). Therefore, the distributions of stresses applied to the left and right sides of the ridge can be caused to be symmetric. As a result, a stable light distribution can be achieved, and therefore, for each laser apparatus, variations in the full width at half maximum and the shape of the FFP, variations in the optical axis, the deviation of the optical axis and the like can be reduced, and a high kink level can be ensured.

Moreover, according to the example semiconductor laser apparatus, the shock attenuating portion having a height greater than or equal to that of the ridge is provided on the sides of the ridge, whereby mounting damage during mounting of a chip can be reduced.

Moreover, according to the example semiconductor laser apparatus, by increasing a distance between the ridge and the trench, a leakage current which is caused by a region damaged by dry etching can be reduced, whereby the occurrence of a quadrature current can be reduced.

Therefore, according to the example semiconductor laser apparatus, the aforementioned structure can provide a semiconductor laser apparatus having a stable characteristic and capable of maintaining reliability for a long period of time even when high-output operation is performed.

In the example semiconductor laser apparatus, the substrate may be made of GaN, and the first-conductivity type layer and the second-conductivity type layer may be made of AlGaN. In this case, as the difference in lattice constant between AlGaN and GaN is large, a large stress is applied to the semiconductor material of the active layer, the ridge and the like. Therefore, the aforementioned advantage of the present disclosure is significantly exhibited.

In the example semiconductor laser apparatus, the trench may penetrate the first-conductivity type layer. In this case, for example, it is possible to sufficiently reduce a stress applied to the semiconductor material of the active layer, the ridge and the like, which is caused by the lattice constant difference between AlGaN and GaN. Therefore, the symmetry of the refractive index distribution can be improved.

In the example semiconductor laser apparatus, the distance between the ridge and the trench may be substantially the same as the first width. In this case, the distributions of stresses applied to the left and right sides of the ridge can be caused to be more symmetric, and therefore, the refractive index distributions on the left and right sides of the ridge are also symmetric, whereby the light distribution is stabilized. Therefore, variations in the full width at half maximum and the shape of the FFP, variations in the optical axis, the deviation of the optical axis and the like can be reduced, and a high kink level can be ensured.

In the example semiconductor laser apparatus, the trench may be formed, extending along the optical waveguide direction from a light emitting facet toward a rear facet. In this case, the following advantage is obtained. Specifically, in the semiconductor laser apparatus, the light emitting facet is covered with a coat film having a low reflectance, and the facet (rear facet) opposite to the light emitting facet is covered with a coat film having a high reflectance, whereby light generated in the chip can be efficiently emitted output of the chip. Also in this case, the light intensity gradually increases from the rear facet toward the light emitting facet, and therefore, the light distribution closer to the light emitting facet more largely contributes to a laser characteristic. Therefore, if the trench is formed in at least a region extending from the light emitting facet to the center portion of the resonator, the refractive index distributions on the left and right sides of the ridge are symmetric in a region having a large light intensity distribution in a resonator length direction (i.e., an optical waveguide direction), whereby the light distribution can be stabilized. As a result, variations in the full width at half maximum and the shape of the FFP, variations in the optical axis, the deviation of the optical axis and the like can be reduced, and a high kink level can be ensured.

In the example semiconductor laser apparatus, the trench may be formed, extending along the optical waveguide direction from the light emitting facet to the center portion of the resonator, and a wire may be coupled to a portion of the second region extending from the center portion of the resonator to the rear facet. In this case, a wire bonding region for supplying a current can be ensured, and therefore, it is possible to reduce the damage of the ridge during mounting of the semiconductor laser apparatus.

In the example semiconductor laser apparatus, the trench may be formed, extending along the optical waveguide direction from the light emitting facet to the center portion of the resonator. A portion of the current blocking layer extending from the light emitting facet to the center portion of the resonator may be made of a first material, and a portion of the current blocking layer extending from the center portion of the resonator to the rear facet may be made of a second material which is different from the first material. In this case, the following advantage is obtained. Specifically, the trench is formed, extending along the optical waveguide direction from the light emitting facet to the center portion of the resonator, but is not formed along the optical waveguide direction between the center portion of the resonator and the rear facet. Therefore, if the current blocking layer may be uniformly made of the same material over the entire resonator, changes in the refractive index on the left and right sides of the ridge differ between a first-half portion (closer to the light emitting facet) and a second-half portion (closer to the rear facet) of the resonator. In contrast to this, by changing the material for the current blocking layer between the first-half portion and the second-half portion of the resonator, the aforementioned difference can be reduced, whereby a stabler light distribution can be achieved. Therefore, variations in the full width at half maximum and the shape of the FFP, variations in the optical axis, the deviation of the optical axis and the like can be reduced, and a high kink level can be ensured, whereby a high yield can be achieved.

Note that, when the material for the current blocking layer is changed between the first-half portion and the second-half portion of the resonator, the substrate may be made of a nitride semiconductor material, and $K1<K0<K2$ may be established, where $K0$ is a thermal expansion coefficient of the nitride semiconductor material, $K1$ is a thermal expansion coefficient of the first material, and $K2$ is a thermal expansion coefficient of the second material. In this case, the stress can be reduced not only in the first-half portion of the resonator in which the trench is formed, but also in the second-half portion of the resonator in which the trench is not formed, whereby a stabler light distribution can be achieved. As a result, variations in the full width at half maximum and the shape of the FFP, variations in the optical axis, the deviation of the optical axis and the like can be reduced, and a high kink level can be ensured. Moreover, there is substantially no locally applied stress in the semiconductor layer, and therefore, a uniform stress is applied to the entire chip, whereby reliability can be ensured for a longer period of time even when high-output operation is performed.

In the example semiconductor laser apparatus, the trench may intersect a cleavage guide trench closer to the light emitting facet. In this case, the following advantage is obtained. Specifically, a material for the substrate, such as GaN crystal or the like, is of the hexagonal system and has a poor cleavage ability, and therefore, the cleavage guide trench for improving the cleavage ability is used to improve the yield of the device which survives a cleavage process. Here, if the trench extending from the upper surface of the shock attenuating portion and reaching at least the first-conductivity type layer is caused to intersect the cleavage guide trench, a reduction in the yield of the device which survives the cleavage process can be reduced. In this case, if $H1<H2$ is established where $H1$ is a depth of the trench and $H2$ is a depth of the cleavage guide trench, the deeper cleavage guide trench is cleaved with priority, whereby the reduction in the yield of the device which survives the cleavage process cleavage can be further reduced.

In the example semiconductor laser apparatus, the sum of the first width and the second width may be 160 μm or less, and the first width may be not less than 30 μm and less than 80 μm. In this case, an excellent characteristic can be exhibited even when high-output operation is performed, without a degradation in the heat dissipation ability of a chip.

As described above, according to the example semiconductor laser apparatus, when the area of a chip is reduced, then if the trench extending from the shock attenuating portion which is an uppermost surface of the chip and reaching the first-conductivity type layer, and the wire are disposed at respective appropriate positions, and an appropriate material for the current blocking layer is selected, the stress distribution and the refractive index distribution in the chip can be caused to be symmetric with respect to the ridge. As a result, the light distribution can be stabilized, and therefore, variations in the full width at half maximum and the shape of the FFP, variations in the optical axis, the deviation of the optical axis and the like can be reduced, and a high kink level can be ensured, resulting in an excellent semiconductor laser apparatus. Moreover, mounting damage during mounting of the chip can be reduced by the shock attenuating portion, whereby a reduction in reliability can be reduced.

Specifically, according to the example semiconductor laser apparatus, the reduction in the chip area can reduce the cost, and at the same time, the stabilization of the light distribution can reduce variations in characteristics, such as FFP, kink and the like, resulting in a high yield. Moreover, reliability can be maintained for a long period of time even when high-temperature and high-output operation is performed. Therefore, the example semiconductor laser apparatus is useful as a laser light source in the field of optical disk systems and the like.

DETAILED DESCRIPTION

First Embodiment

A semiconductor laser apparatus according to a first embodiment of the present disclosure will be described hereinafter with reference to the accompanying drawings.

Figure 1:
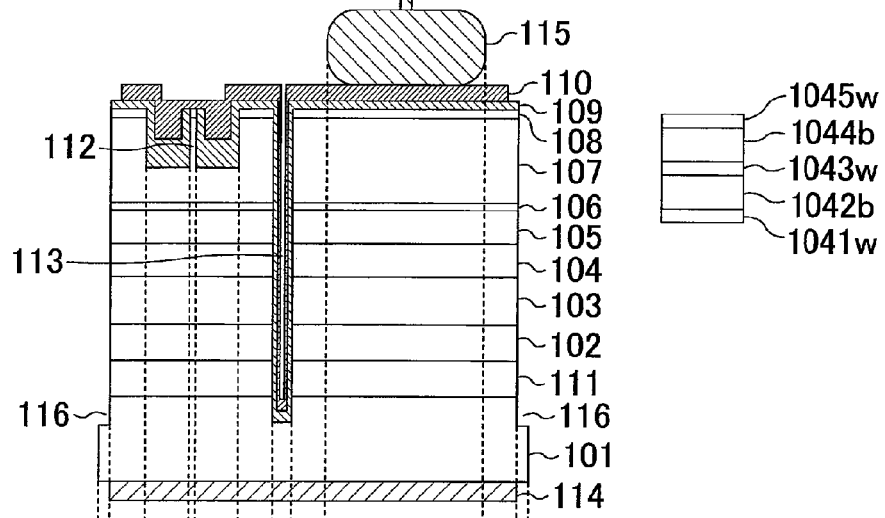
FIG. 1 is a diagram showing a semiconductor laser apparatus according to a first embodiment of the present disclosure, where (a) and (b) are a cross-sectional view and a top view, respectively, showing a structure of the semiconductor laser apparatus, and (c) is a cross-sectional view showing a detailed structure of an active layer of the semiconductor laser apparatus.
Figure 1:
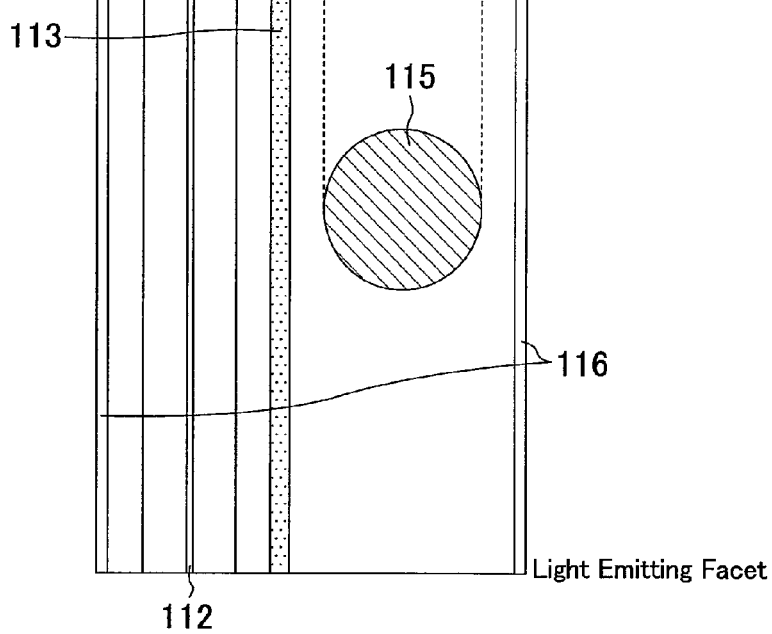

FIG. 1 is a diagram showing the semiconductor laser apparatus of the first embodiment, where (a) and (b) are a cross-sectional view and a top view, respectively, showing a structure of the semiconductor laser apparatus, and (c) is a cross-sectional view showing a detailed structure of an active layer of the semiconductor laser apparatus.

As shown in (a) and (b) of FIG. 1, for example, the semiconductor laser apparatus of this embodiment includes an n-type buffer layer 111, an n-type cladding layer 102, an n-type light guide layer 103, an active layer 104, a p-type intermediate layer 105, a p-type cap layer 106, a p-type cladding layer 107 and a p-type contact layer 108, which are formed in this stated order on a substrate 101 having a thickness of about 100 μm made of n-type GaN doped with an n-type impurity.

The n-type buffer layer 111 is, for example, made of a GaN layer having a thickness of about 2.0 μm, which contains silicon (Si) having a density of about $5 \times 10^{17}$ cm$^{-3}$ as an n-type impurity.

The n-type cladding layer 102 is, for example, made of an AlGaN layer having a thickness of about 2.5 μm, which contains silicon (Si) having a density of about $5 \times 10^{17}$ cm$^{-3}$ as an n-type impurity.

The n-type light guide layer 103 is, for example, made of a GaN layer having a thickness of about 200 μm, which contains silicon (Si) having a density of about $1 \times 10^{17}$ cm$^{-3}$ as an n-type impurity.

The active layer 104, for example, has a multiple quantum well structure in which a well layer 1041w, a barrier layer 1042b, a well layer 1043w, a barrier layer 1044b and a well layer 1045w are formed in this stated order, as shown in (c) of FIG. 1. Here, the well layers 1041w, 1043w and 1045w are, for example, each made of an InGaN layer having a thickness of about 5 nm, and the barrier layers 1042b and 1044b are, for example, each made of an InGaN layer having a thickness of about 10 nm.

The p-type intermediate layer 105 is, for example, made of an InGaN layer having a thickness of about 100 nm, which contains magnesium (Mg) having a density of about $1 \times 10^{17}$ cm$^{-3}$ as a p-type impurity.

The p-type cap layer 106 and the p-type cladding layer 107 are, for example, made of an AlGaN layer having a thickness of about 10 nm and an AlGaN layer having a thickness of about 500 nm, respectively, both of which contain magnesium (Mg) having a density of about $1 \times 10^{19}$ cm$^{-3}$ as a p-type impurity. Here, the p-type cap layer 106 has a function of efficiently confining electrons in the active layer 104.

The p-type contact layer 108 is, for example, made of a GaN layer having a thickness of about 50 nm, which contains magnesium (Mg) having a density of about $1 \times 10^{20}$ cm$^{-3}$ as a p-type impurity.

Note that, in this embodiment, needless to say, the layers 102-108 constituting the semiconductor multilayer structure are not limited to the aforementioned arrangement, if the function of the semiconductor laser apparatus is achieved.

Moreover, in this embodiment, the aforementioned semiconductor multilayer structure is formed so that the chip has a length (resonator length) of 800 μm and a width of 160 μm.

Moreover, in a portion of the p-type cladding layer 107 and the p-type contact layer 108, a ridge 112 having a width of about 1.5 µm is formed, extending in a resonator length direction (optical waveguide direction). Moreover, the p-type cladding layer 107 and the p-type contact layer 108 are left intact in regions on opposite sides of the ridge 112 with a recess being interposed therebetween. These regions will serve as a shock attenuating portion when the chip is mounted onto a stem or the like. As a result, damage to the chip by mounting is reduced, whereby high reliability can be ensured over a long period of time. Although the height of the ridge 112 is substantially the same as the height of the shock attenuating portion in this embodiment, the aforementioned advantage can be achieved even if the shock attenuating portion is higher than the ridge 112.

Moreover, a center of the ridge 112 is located at a distance of 40 µm from a left end of the chip (the distance between the center of the ridge 112 and a right end of the chip is 120 µm), but not at a center of the chip width (a position at a distance of 80 µm from both ends of the chip), and therefore, the widths of regions on the left and right sides of the ridge 112 are asymmetric.

Moreover, a trench 113 which extends from an upper surface of the p-type contact layer 108 and reaches the inside of the substrate 101 is formed at a position away from the ridge 112 toward the right end of the chip. The trench 113 also continuously extends along the resonator length direction from a light emitting facet to a rear facet. The trench 113 plays a role in reducing a stress in the semiconductor multilayer structure which is caused by the difference in lattice constant between GaN of the substrate 101 and AlGaN of the n-type cladding layer 102, the p-type cap layer 106 and the p-type cladding layer 107. The trench 113 can reduce the change in the refractive index in the semiconductor multilayer structure, so that the light distribution is stabilized, whereby, for example, variations in the full width at half maximum and the shape of the FFP, the optical axis deviation, variations in the kink level, and the like can be reduced.

Note that, needless to say, when the n-type buffer layer 111 made of the same composition as that of the substrate 101 is formed on the substrate 101, the trench 113 does not need to penetrate the n-type buffer layer 111. Although it is preferable that the trench 113 penetrate the buffer layer 111 to reach the inside of the substrate 101, the effect of stabilizing the light distribution can be obtained if the trench 113 penetrates at least the active layer 104. The reason is as follows. Specifically, a stress which is induced by a lattice constant mismatch between the p-type contact layer 108 or the n-type light guide layer 103 made of GaN and the p-type cladding layer 107 or the p-type cap layer 106 in which the ridge 112 is formed and which is made of AlGaN, can be reduced by the trench 113 which penetrates at least the active layer 104, whereby a large portion of the stress applied to the entire chip can be reduced.

Moreover, in this embodiment, the ridge 112 is disposed away from the trench 113 reaching the substrate 101, and therefore, it is possible to reduce a leakage current which is caused by a region damaged by dry etching which is performed to form the trench 113, whereby a quadrature current can be reduced. Specifically, the distance between the ridge 112 and the trench 113 reaching the substrate 101 may be not less than 30 µm and less than 80 µm. If the distance is not less than 30 µm, the leakage current can be reduced and a temperature characteristic (characteristic temperature To) can be stabilized. Moreover, if the distance is less than 80 µm, characteristics such as the FFP, the kink level and the like can be stabilized.

Moreover, in the semiconductor laser apparatus of this embodiment, a cleavage guide trench 116 which extends from the p-type contact layer 108 and reaches the substrate 101 is formed at an end of the chip along the resonator length direction. Here, GaN crystal of the substrate 101 is of the hexagonal system and has a poor cleavage ability, and therefore, in this embodiment, the cleavage guide trench 116 is provided to improve the cleavage ability. As a result, the chip can be cleaved into a desired shape and the chance that a defective device is caused by faulty cleavage can be reduced, whereby the yield can be stabilized.

Moreover, a current blocking layer 109 is formed on the semiconductor multilayer structure of this embodiment on both sides of the ridge 112. In other words, the current blocking layer 109 is formed on an uppermost surface of the semiconductor multilayer structure including the inside of the trench 113, excluding the upper surface of the ridge 112. The current blocking layer 109 is, for example, made of a $SiO_2$ film having a thickness of about 300 nm.

Moreover, a positive electrode 110 is formed on the current blocking layer 109. The positive electrode 110 is electrically connected to the p-type contact layer 108, and is formed by laminating, for example, palladium (Pd), platinum (Pt), titanium (Ti), gold (Au) or the like.

On the other hand, a negative electrode 114 is formed on a lower surface of the substrate 101. The negative electrode 114 is formed by laminating, for example, titanium (Ti), platinum (Pt), gold (Au) or the like.

A wire 115 made of, for example, Au or the like for supplying a current is coupled to a region of the semiconductor multilayer structure of this embodiment in which the positive electrode 110 is formed. Here, it is taken into account that the wire 115 has a diameter of about 50±5 µm, overall variations during fabrication of a laser chip including the accuracy of positioning of a mask and the like (device fabrication process variations) fall within about ±5 µm, overall variations during separation of a wafer into chips including the deviation of a cleavage position and the like (separation process variations) fall within about ±10 µm, and the mounting accuracy of wire bonding is about ±10 µm. Therefore, a region having a dimension of about 50±30 µm needs to be ensured to stably dispose the wire 115. In other words, the wire 115 may be deviated by a maximum of about ±30 µm from a desired position. Therefore, a wire bonding region having a dimension of at least about 80 µm including the wire diameter of 50 µm needs to be ensured. Unless a region having such a size is ensured, a chip having the ridge 112 damaged by wire bonding may be formed, leading to a trouble, such as a reduction in light emission efficiency or a lack of long-term reliability.

It has been assumed above that the region for stably disposing the wire 115 has a dimension of about 50±30 µm. Alternatively, if the diameter of the wire 115 can be reduced or variations due to processes, mounting or the like can be reduced, the region can be further reduced, whereby the chip area can be further reduced.

FIGS. 2A-2D show a full width at half maximum of an FFP, a shape of the FFP, a distribution of horizontal optical axes, and current-light output characteristics, respectively, of the semiconductor laser apparatus of this embodiment. FIGS. 2E-2H show a full width at half maximum of an FFP, a shape of the FFP, a distribution of horizontal optical axes, and current-light output characteristics, respectively, of the semiconductor laser apparatus of this embodiment in which the trench 113 is not formed, as a comparative example.

Figure 2A:
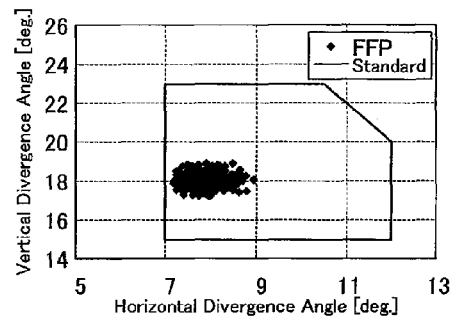
FIGS. 2A-2D are diagrams showing a full width at half maximum of an FFP, a shape of the FFP, a distribution of horizontal optical axes, and current-light output characteristics, respectively, of the semiconductor laser apparatus of the first embodiment of the present disclosure.
Figure 2E:
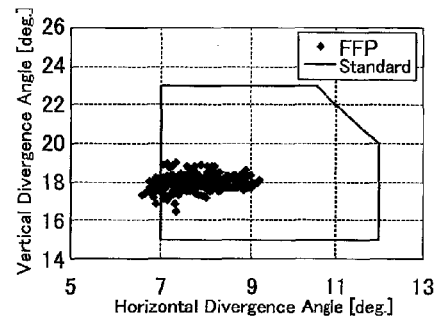
FIGS. 2E-2H are diagrams showing a full width at half maximum of an FFP, a shape of the FFP, a distribution of horizontal optical axes, and current-light output characteristics, respectively, of the semiconductor laser apparatus of the first embodiment of the present disclosure in which a trench is not formed, as a comparative example.

Firstly, as shown in FIGS. 2A and 2E, this embodiment (the trench 113 is formed) has smaller variations in the full width at half maximum of the FFP than that of the comparative example (the trench 113 is not formed). This may be because the stress in the semiconductor multilayer structure which is caused by the lattice constant difference between GaN of the substrate 101 and AlGaN of the n-type cladding layer 102 and the like is reduced by the trench 113, so that the refractive index is uniform, resulting in a stable light distribution.

Figure 2B:
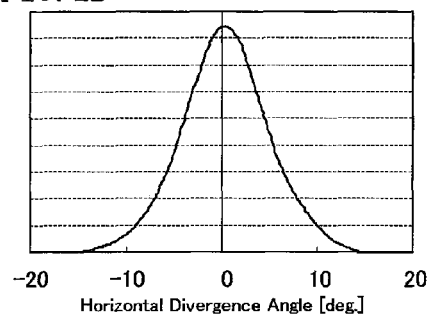
Figure 2F:
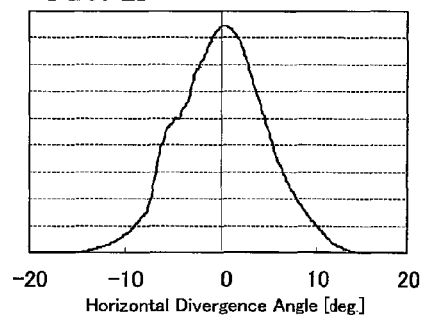

Next, as shown in FIG. 2B, the FPP shape of this embodiment (the trench 113 is formed) is unimodal. On the other hand, in the comparative example (the trench 113 is not formed), many devices were observed which had an FFP shape which was disturbed by occurrence of a small sub-peak on the left side, as shown in FIG. 2F. This is because, when the trench 113 is not formed, the stresses in the semiconductor multilayer structure on the left and right sides of the ridge 112 are asymmetric. Specifically, when the trench 113 is not formed, there is a larger change in the stress in the left region with respect to the center position of the ridge 112, while there is a smaller change in the stress in the right region with respect to the center position of the ridge 112. Therefore, a change in the refractive index of the p-type cladding layer 107 in the region on the left side of the ridge 112 is greater than a change in the refractive index of the p-type cladding layer 107 in the region on the right side of the ridge 112. As a result, the light distribution is more greatly affected by the change in the refractive index in the region on the left side of the ridge 112. This may be the reason why many chips were formed in which a sub-peak occurs in the left portion of the FFP shape.

Figure 2C:
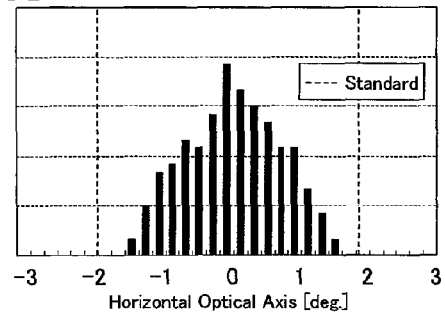
Figure 2G:
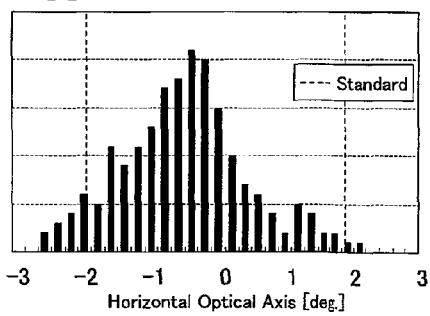
Figure 2D:
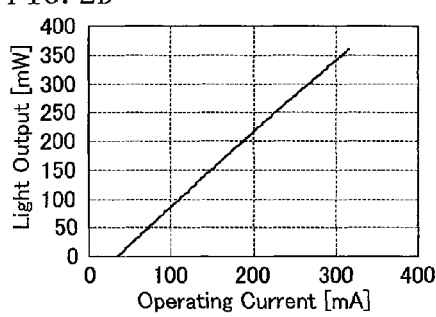

Next, as shown in FIGS. 2C and 2G, in this embodiment (the trench 113 is formed), the center of the horizontal optical axis distribution is located in a vicinity of 0°, and as compared to the comparative example (the trench 113 is not formed), variations in the magnitude of the optical axis deviation are small, i.e., a good result is obtained. This may be because the trench 113 reduces the asymmetry of the refractive index changes of the waveguide in the regions on the left and right sides of the ridge 112, and therefore, the horizontal optical axis is located in a vicinity of 0° and variations in the magnitude of the optical axis deviation is reduced. On the other hand, when the trench 113 is not formed, the change in the light distribution in the region on the left side of the ridge 112 is larger and the refractive index of the p-type cladding layer 107 directly below the region on the left side of the ridge 112 is greater, and this may be the reason why the average value of the horizontal optical axis is slightly lower than 0° (on the left side). Moreover, when the trench 113 is not formed, the refractive index distributions in the regions on the left and right sides of the ridge 112 are asymmetric, and this may be the reason why variations in the magnitude of the optical axis deviation are larger.

Figure 2H:
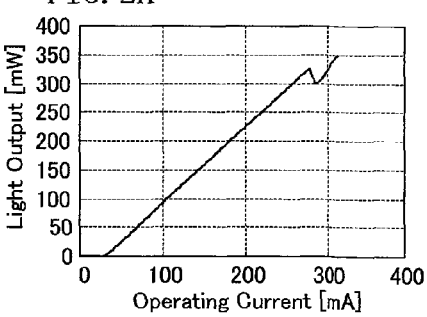

Finally, regarding the current-light output characteristics shown in FIGS. 2E and 2H, a light output exceeding 350 mW is obtained in this embodiment (the trench 113 is formed), while many devices were observed in which kink occurs at a light output of less than 320 mW in the comparative example (the trench 113 is not formed). The reason may be as follows. Specifically, when the trench 113 is not formed, the stress distributions in the semiconductor multilayer structure on the left and right sides of the ridge 112 are asymmetric, and therefore, the refractive index distributions on the left and right sides of the ridge 112 are also asymmetric. As a result, the light distributions on the left and right sides of the ridge 112 are also asymmetric, and therefore, the active carrier density distributions in the active layer 104 on the left and right sides of the ridge 112 are also asymmetric. Moreover, the distributions of the refractive index and gain of the waveguide on the left and right sides of the ridge 112 are also asymmetric, respectively, and therefore, horizontal high-order transverse-mode oscillation is likely to occur, so that the kink level is reduced.

According to the results shown in FIGS. 2A-2H, it has been confirmed that the asymmetry of stresses induced in the regions on the left and right sides of the ridge 112 is responsible for the differences in the characteristics. Moreover, it has been clarified that the trench 113 improves the characteristics, such as the FFP characteristic, the kink level and the like.

Moreover, when the semiconductor laser apparatus of this embodiment in which the trench 113 is formed was operated under high-temperature and high-output conditions where the temperature is 80° C. and the pulse light output is 320 mW, it was found that the operation of the semiconductor laser apparatus was stable for 1000 hours or more. The reason why such a stable operation can be achieved may be as follows. Firstly, in this embodiment, a region where the p-type cladding layer 107 and the p-type contact layer 108 are left intact is ensured as a shock attenuating portion on both sides of the ridge 112. As a result, it is possible to reduce damage caused by wire bonding during mounting. Secondly, in this embodiment, the ridge 112 is disposed away from the trench 113 reaching the substrate 101, and therefore, it is possible to reduce a leakage current which is caused by a lattice defect in a region damaged by dry etching which is performed to form the trench 113, whereby high reliability can be ensured.

The results of studying to what level the chip area can be reduced by the structure of this embodiment will be described hereinafter. As described above, in order to dispose the wire 115 in the region having the greater distance between the center position of the ridge 112 and a chip end (in this embodiment, the region on the left side of the ridge 112), the wire disposition region needs to have a size of about 50±30 μm including the process variations, the mounting variations and the like. The region having the greater distance between the center position of the ridge 112 and a chip end needs to have a width of at least 80 μm so as to ensure the wire disposition region. In other words, the width of the region having the greater distance between the center position of the ridge 112 and a chip end cannot be caused to be smaller than 80 μm. Therefore, when the chip area is reduced, it is important to reduce the width of the region having the smaller distance between the center position of the ridge 112 and a chip end (in this embodiment, the region on the right side of the ridge 112) to the extent possible.

Incidentally, the ability to dissipate heat is an example of parameters to which attention is particularly paid when the chip area is reduced. If the heat dissipation ability is poor, the temperature characteristic is degraded, and therefore, desired characteristics cannot be obtained during high-temperature and high-output operation, and moreover, the operating current and the operating voltage are increased, leading to a reduction in reliability.

Moreover, the active layer directly below the ridge generates heat during operation of the semiconductor laser. When a chip has a large size, the heat capacity of the chip is large, and therefore, heat generated in the chip can be efficiently dissipated from the substrate. On the other hand, when the chip size is reduced, the chip heat capacity also decreases, and therefore, the degradation of the temperature characteristic is accelerated.

Figure 3:
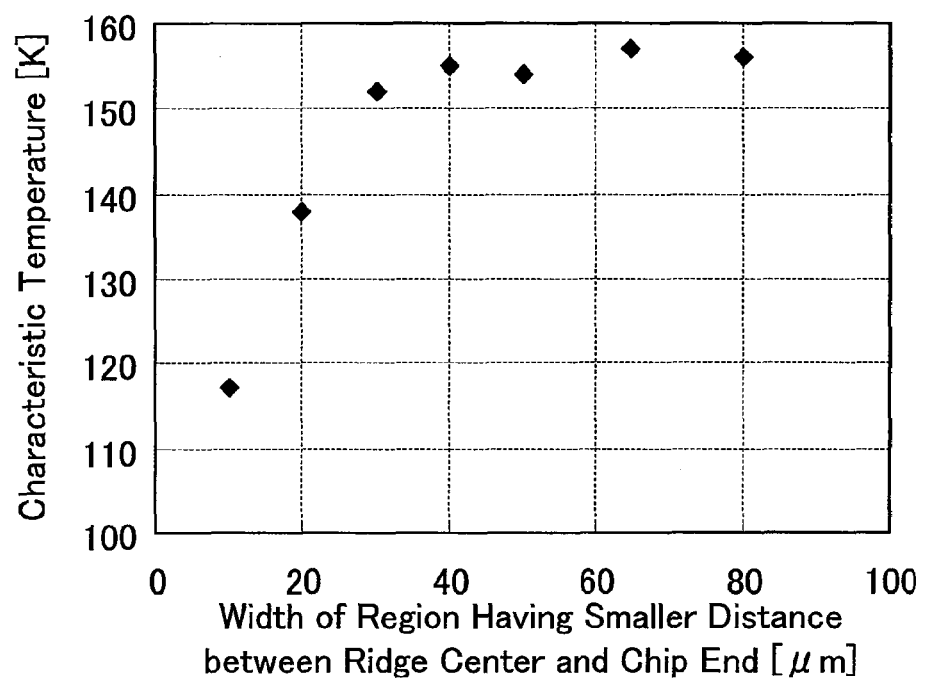
FIG. 3 is a diagram showing changes in a characteristic temperature To in the semiconductor laser apparatus of the first embodiment of the present disclosure when a width of a region having a smaller distance between a center position of a ridge and a chip end is changed.

FIG. 3 shows changes in the characteristic temperature To in the semiconductor laser apparatus of this embodiment when the width of the region having the smaller distance between the center position of the ridge 112 and a chip end (the region on the left side of the ridge 112) is changed while the width of the region having the greater distance between the center position of the ridge 112 and a chip end (the region on the right side of the ridge 112) is fixed to 80 μm and the distance between the center position of the ridge 112 and the trench 113 is fixed to 40 μm. Here, the characteristic temperature To is a parameter which indicates evaluation of the temperature characteristic. For example, as the chip width is decreased, the heat dissipation ability decreases, and therefore, the characteristic temperature To tends to decrease.

As shown in FIG. 3, when the width of the region having the smaller distance between the center position of the ridge 112 and a chip end is between 30 μm and 80 μm, the characteristic temperature To is substantially constant. When the width of the region having the smaller distance between the center position of the ridge 112 and a chip end is smaller than 30 μm, the characteristic temperature To steeply decreases.

As a result, in view of the heat dissipation ability, it was found that the chip width (full width) is preferably 160 μm or less, and the width of the region having the smaller distance between the center position of the ridge 112 and a chip end is preferably at least not less than 30 μm and less than 80 μm.

In the first embodiment, the region having the smaller distance between the center position of the ridge 112 and a chip end is located on the left side of the ridge 112 while the region having the greater distance between the center position of the ridge 112 and a chip end is located on the right side of the ridge 112. Alternatively, the positions of the regions of this embodiment may be reversed. In this case, needless to say, an advantage similar to that of this embodiment can be obtained.

First Variation of First Embodiment

A semiconductor laser apparatus according to a first variation of the first embodiment of the present disclosure will be described hereinafter with reference to the drawings.

Figure 4:
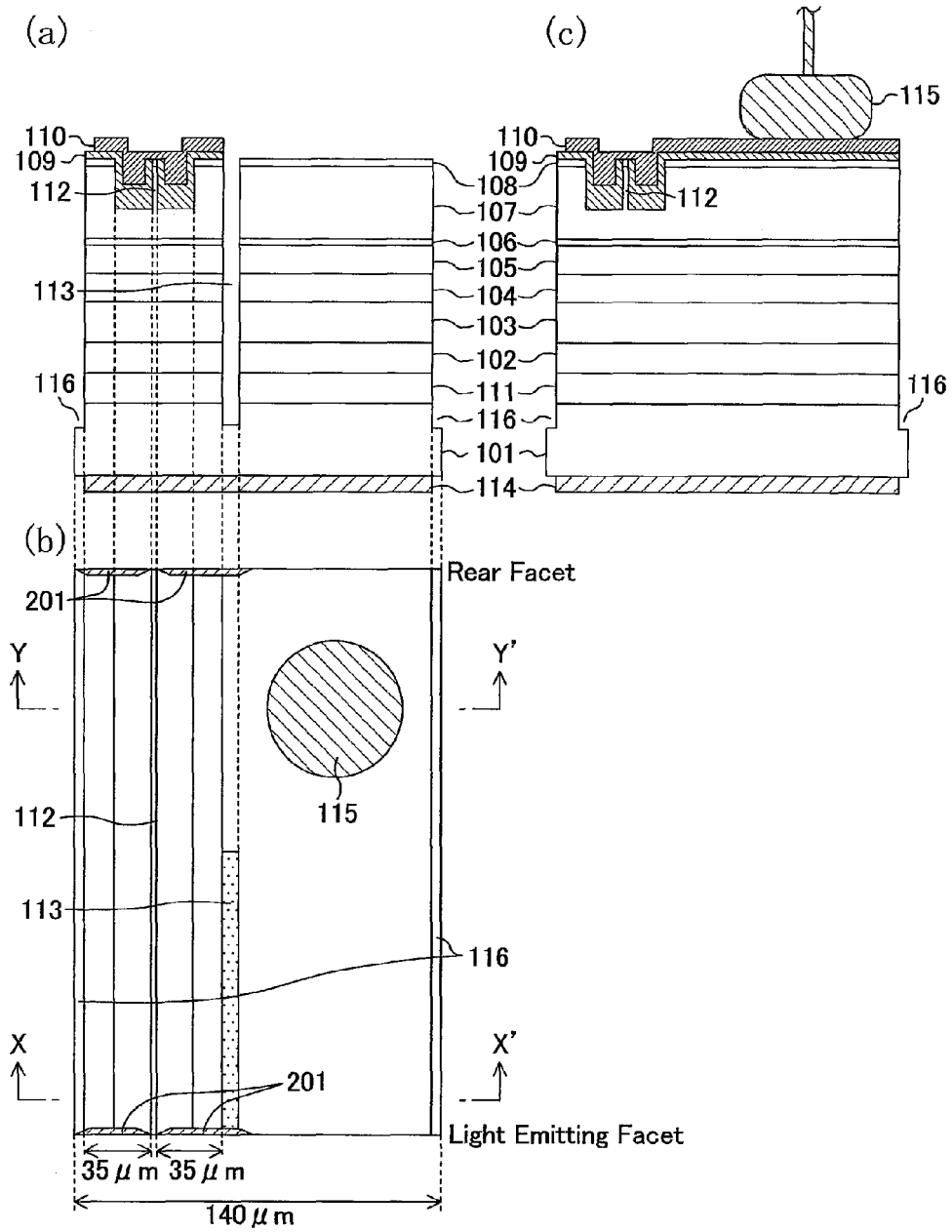
FIG. 4 is a diagram showing a semiconductor laser apparatus according to a first variation of the first embodiment of the present disclosure, where (a) and (c) are cross-sectional views showing a structure of the semiconductor laser apparatus, and (b) is a top view showing the structure of the semiconductor laser apparatus.

FIG. 4 is a diagram showing the semiconductor laser apparatus of the first variation of the first embodiment, where (a) and (c) are cross-sectional views showing a structure of the semiconductor laser apparatus, and (b) is a top view showing the structure of the semiconductor laser apparatus. Here, (a) and (c) of FIG. 4 are cross-sectional views, taken along lines X-X' and Y-Y' of (b) of FIG. 4, respectively. Note that, in (a)-(c) of FIG. 4, the same components as those of the first embodiment of (a) and (b) of FIG. 1 are indicated by the same reference characters and the same description will not be repeated.

As shown in (a)-(c) of FIG. 4, in the semiconductor laser apparatus of this variation, a trench 113 extending from a top surface of a p-type contact layer 108 and reaching the inside of a substrate 101 is formed along a resonator length direction (optical waveguide direction) from a light emitting facet to a center portion of a resonator, and a wire 115 is coupled to a region extending from the center portion of the resonator to a rear facet. Moreover, the trench 113 is provided in a region having a greater distance between a center position of a ridge 112 and a chip end. A distance between the center position of the ridge 112 and the trench 113 in the region is substantially the same as a width of a region having a smaller distance between the center position of the ridge 112 and a chip end. Moreover, a cleavage guide trench 201 is provided in each of the light emitting facet and the rear facet.

In the first embodiment, the trench 113 extending from the upper surface of the p-type contact layer 108 (i.e., the shock attenuating portion having substantially the same height as that of the ridge 112) and reaching the inside of the substrate 101 is continuously formed along the resonator length direction from the light emitting facet to the rear facet. In this case, it is necessary to form the current blocking layer 109 and the positive electrode 110, covering a wall surface of the deep trench 113. However, when the current blocking layer 109 is discontinuously formed on a sidewall surface of the trench 113 (a discontinuous portion occurs), then if the positive electrode 110 covers the discontinuous portion, there is a risk that a leakage current increases, which induces a short circuit fault. Moreover, even when the current blocking layer 109 covers the sidewall surface of the trench 113 without a discontinuous portion, then if a discontinuous portion occurs in the positive electrode 110, there is a risk that an open circuit fault in which a current does not flow occurs.

In this variation, the first embodiment is modified to obtain a similar advantage while avoiding the aforementioned risks.

Specifically, firstly, this variation is different from the first embodiment in that the trench 113 extending from the upper surface of the p-type contact layer 108 and reaching the inside of the substrate 101 is formed from the light emitting facet to the center portion of the resonator, and therefore, a coupling region for the wire 115 is ensured in a region extending from the center portion of the resonator to the rear facet. Moreover, secondly, this variation is different from the first embodiment in that the trench 113 is provided in the region having the greater distance between the center position of the ridge 112 and a chip end, and the distance in the region between the center position of the ridge 112 and the trench 113 is substantially the same as the width of the region having the smaller distance between the center position of the ridge 112 and a chip end.

Figure 5A:
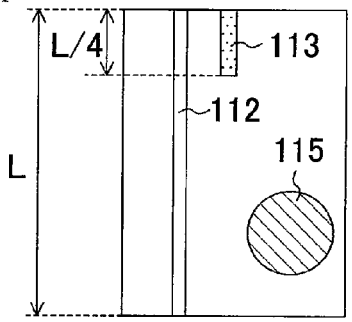
FIG. 5A is a top view schematically showing an arrangement in which a trench is provided, extending to a distance of L/4 from a rear facet where L is a length of a resonator, as a comparative example.
Figure 5B:
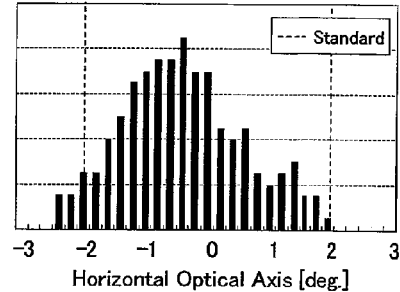
FIG. 5B is a diagram showing a result of a distribution of horizontal optical axes in the arrangement of FIG. 5A.
Figure 5C:
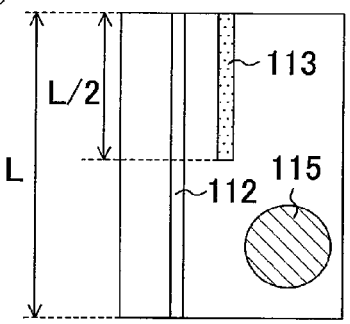
FIG. 5C is a top view schematically showing an arrangement in which a trench is provided, extending to a distance of L/2 from the rear facet where L is the length of the resonator, as a comparative example.
Figure 5D:
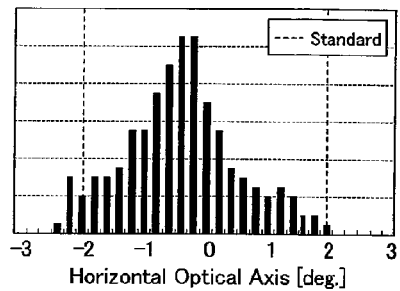
FIG. 5D is a diagram showing a result of a distribution of horizontal optical axes in the arrangement of FIG. 5C.
Figure 5E:
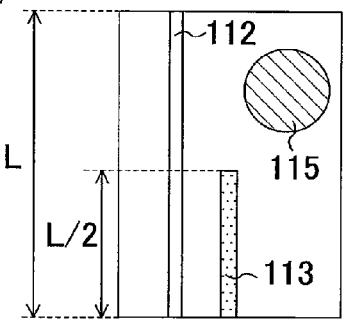
FIG. 5E is a top view schematically showing an arrangement in which a trench is provided, extending to a distance of L/2 from a light emitting facet where L is a length of a resonator, in the semiconductor laser apparatus of the first variation of the first embodiment of the present disclosure.
Figure 5F:
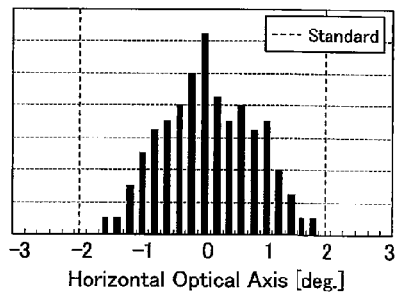
FIG. 5F is a diagram showing a result of a distribution of horizontal optical axes in the arrangement of FIG. 5E.
Figure 5G:
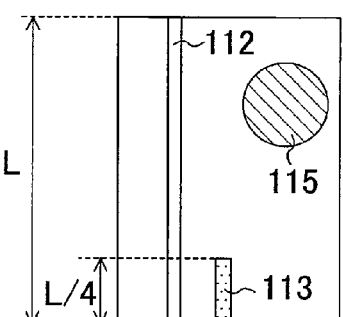
FIG. 5G is a top view schematically showing an arrangement in which a trench is provided, extending to a distance of L/4 from the light emitting facet where L is the length of the resonator, in the semiconductor laser apparatus of the first variation of the first embodiment of the present disclosure.
Figure 5H:
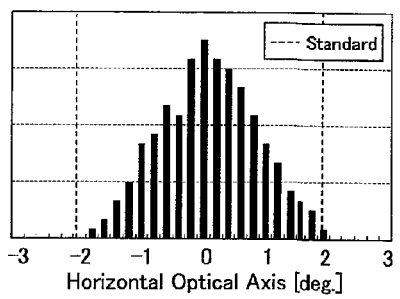
FIG. 5H is a diagram showing a result of a distribution of horizontal optical axes in the arrangement of FIG. 5G.

FIG. 5A is a top view schematically showing an arrangement in which the trench 113 is provided, extending to a distance of L/4 from the rear facet where L is the length of the resonator (=600 μm). FIG. 5B is a diagram showing a result of a distribution of horizontal optical axes in the arrangement of FIG. 5A. FIG. 5C is a top view schematically showing an arrangement in which the trench 113 is provided, extending to a distance of L/2 from the rear facet where L is the length of the resonator (=600 μm). FIG. 5D is a diagram showing a result of a distribution of horizontal optical axes in the arrangement of FIG. 5C. FIG. 5E is a top view schematically showing an arrangement in which the trench 113 is provided, extending to a distance of L/2 from the light emitting facet where L is the length of the resonator (=600 μm). FIG. 5F is a diagram showing a result of a distribution of horizontal optical axes in the arrangement of FIG. 5E. FIG. 5G is a top view schematically showing an arrangement in which the trench 113 is provided, extending to a distance of L/4 from the light emitting facet where L is the length of the resonator (=600 μm). FIG. 5H is a diagram showing a result of a distribution of horizontal optical axes in the arrangement of FIG. 5G. Note that, in FIGS. 5A, 5C, 5E and 5G, the same components as those of the structures of (a)-(c) of FIG. 4 are indicated by the same reference characters. The results of experiments shown in FIGS. 5A-5G are obtained where the width (full width) of the chip is 140 μm, the distance between the center position of the ridge 112 and a chip end on the left side of the ridge 112 (specifically, a portion where the cleavage guide trench 116 is formed) is 35 μm, and the distance between the center position of the ridge 112 and the trench 113 located on the right side of the ridge 112 is 35 μm (see (c) of FIG. 4).

As shown in FIGS. 5E-5H, when the trench 113 is formed closer to the light emitting facet, the center of the horizontal optical axis distribution is located in a vicinity of 0°, and therefore, variations are small, i.e., good results are obtained as compared to when the trench 113 is formed closer to the rear facet (see FIGS. 5A-5D).

This result is related to a light intensity distribution in the resonator length direction in the chip. Specifically, in the semiconductor laser apparatus, the light emitting facet is covered with a coat film having a low reflectance, while the rear facet is covered with a coat film having a high reflectance. In this case, the light intensity gradually increases from the rear facet toward the light emitting facet, and therefore, the light distribution closer to the light emitting facet largely contributes to the laser characteristics. Therefore, if the trench 113 is formed from the light emitting facet toward the rear facet (i.e., to the center portion of the resonator), the refractive index distributions in the regions on the left and right sides of the ridge 112 are symmetric in a portion in the resonator length direction where the light intensity is great, and this may be the reason why the light distribution can be stabilized. As a result, the center of the horizontal optical axis distribution may be located in a vicinity of 0°, and this may be the reason why the variations can be reduced.

Moreover, in this variation, the aforementioned good result is obtained partly because the trench 113 is provided in the region having the greater distance between the center position of the ridge 112 and a chip end, and the distance between the center position of the ridge 112 and the trench 113 in the region is "substantially the same as" the width of the region having the smaller distance between the center position of the ridge 112 and a chip end. Specifically, the distance between the center position of the ridge 112 and the trench 113 in the region having the greater distance between the center position of the ridge 112 and a chip end is set to be "substantially the same as" the width of the region having the smaller distance between the center position of the ridge 112 and a chip end. Therefore, the stress distributions in the semiconductor multilayer structure on the left and right sides of the ridge 112 are symmetric and the change amounts of stress in the distributions are reduced. As a result, the change in the refractive index is reduced, whereby the light distribution is stabilized, and this may be the reason why the good result is obtained.

Note that the results of the experiments of FIGS. 5E-5H are obtained when the trench 113 is formed, extending to a distance of L/2 from the light emitting facet where L is the resonator length. The range within which the trench 113 is formed is not particularly limited, if a region in which the wire 115 is provided is ensured at a position closer to the rear facet. For example, the trench 113 may be formed, extending to a distance of 3L/4 from the light emitting facet where L is the resonator length, i.e., the trench 113 which is longer may be formed along the resonator length direction.

Moreover, in this variation, the wall surface of the trench 113 which is formed from the light emitting facet to the center portion of the resonator and extends from the upper surface of the p-type contact layer 108 and reaches the inside of the substrate 101, is not covered with the current blocking layer 109 or the positive electrode 110. As a result, the aforementioned causes for the yield reduction, such as a short circuit fault, an open circuit fault and the like, can be reduced. On the other hand, the trench 113 is not formed in the region extending from the center portion of the resonator to the rear facet, and therefore, the flatness of the region is ensured. Therefore, the discontinuous formation of the current blocking layer 109 and the positive electrode 110 is reduced. Therefore, a chip which fails to emit light due to a short circuit fault, an open circuit fault or the like is not fabricated, resulting in a high yield.

Moreover, the trench 113 is not formed between the center portion of the resonator and the rear facet, and therefore, a large coupling region for the wire 115 can be ensured. As a result, a chip in which the ridge 112 is damaged by wire bonding is not fabricated, whereby a reduction in yield can be reduced and long-term reliability can be ensured.

Moreover, the trench 113 which extends from the p-type contact layer 108 and reaches the inside of the substrate 101, intersects the cleavage guide trench 201 in the light emitting facet. Here, the GaN crystal of the substrate 101 is of the hexagonal system and has a poor cleavage ability, and therefore, the cleavage guide trench 201 is provided to improve the yield of the device which survives the cleavage process. Moreover, the trench 113 extending from the p-type contact layer 108 and reaching the inside of the substrate 101 preferably intersects the cleavage guide trench 201. The reason is as follows.

Figure 6A:
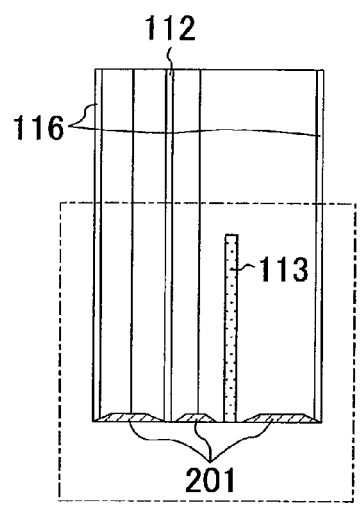
FIGS. 6A and 6B are a top view and its enlarged view, respectively, schematically showing a comparative example in which a cleavage guide trench and a trench do not intersect.
Figure 6B:
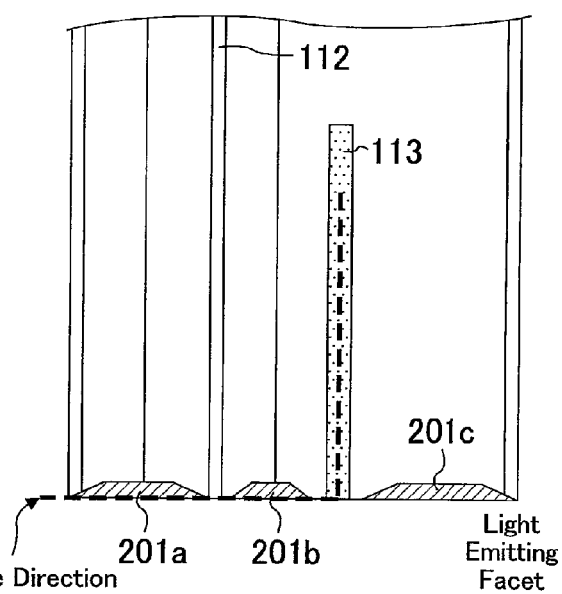
Figure 6C:
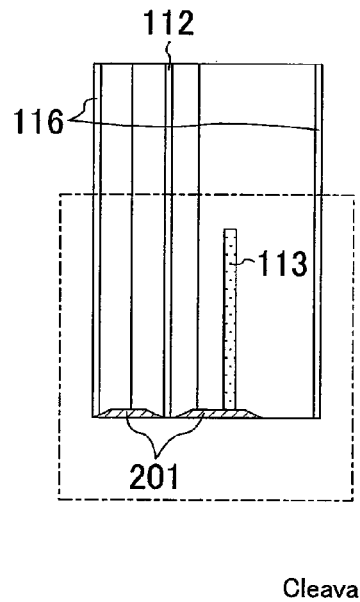
FIGS. 6C and 6D a top view and its enlarged view, respectively, schematically showing the semiconductor laser apparatus of the first variation of the first embodiment of the present disclosure in which a cleavage guide trench and a trench intersect.
Figure 6D:
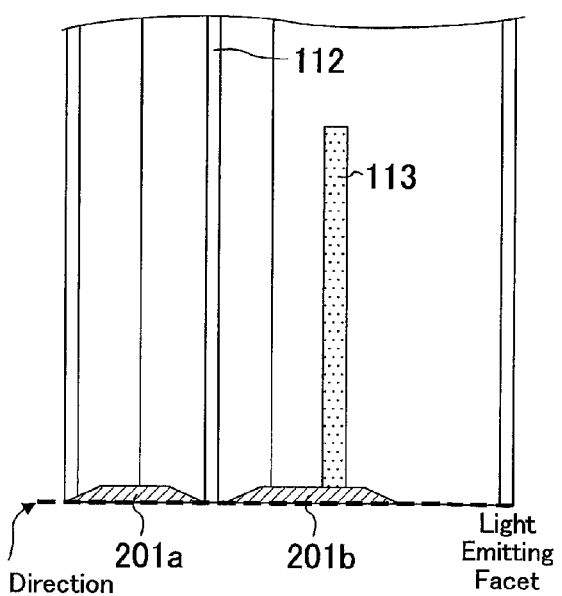

FIGS. 6A and 6B are a top view and its enlarged view, respectively, schematically showing a comparative example in which the cleavage guide trench 201 and the trench 113 do not intersect. FIGS. 6C and 6D a top view and its enlarged view, respectively, schematically showing this variation in which the cleavage guide trench 201 and the trench 113 intersect. Note that, in FIGS. 6A-6D, the same components as those of (a)-(c) of FIG. 4 are indicated by the same reference characters.

In the comparative example of FIGS. 6A and 6B, a trench 113 is provided between a cleavage guide trench 201*b* and a cleavage guide trench 201*c*. This comparative example was studied. As a result, it was found that many chips were observed in which the cleavage direction was altered in a vicinity of the trench 113 between the cleavage guide trench 201*b* and the cleavage guide trench 201*c*, and therefore, the yield of the device which survive the cleavage process was reduced. On the other hand, as in the variation of FIGS. 6C and 6D, i.e., when the cleavage guide trench 201 (specifically, the cleavage guide trench 201*b*) intersects the trench 113, the cleavage direction was not altered in a vicinity of the trench 113, and therefore, chips were successively separated along a desired cleavage direction.

Note that, in this variation, in order to further improve the yield of the device which survives the cleavage process, it is preferable that H1<H2 be established, where H1 is a depth of the trench 113 and H2 is a depth of the cleavage guide trench 201. In this case, the deeper cleavage guide trench 201 is cleaved with priority, and therefore, it is possible to further reduce a defect that the cleavage direction is deviated into a direction in which the trench 113 is formed. As a result, the yield of the device which survives the cleavage process can be further improved.

Second Variation of First Embodiment

A semiconductor laser apparatus according to a second variation of the first embodiment of the present disclosure will be described hereinafter with reference to the drawings.

Figure 7:
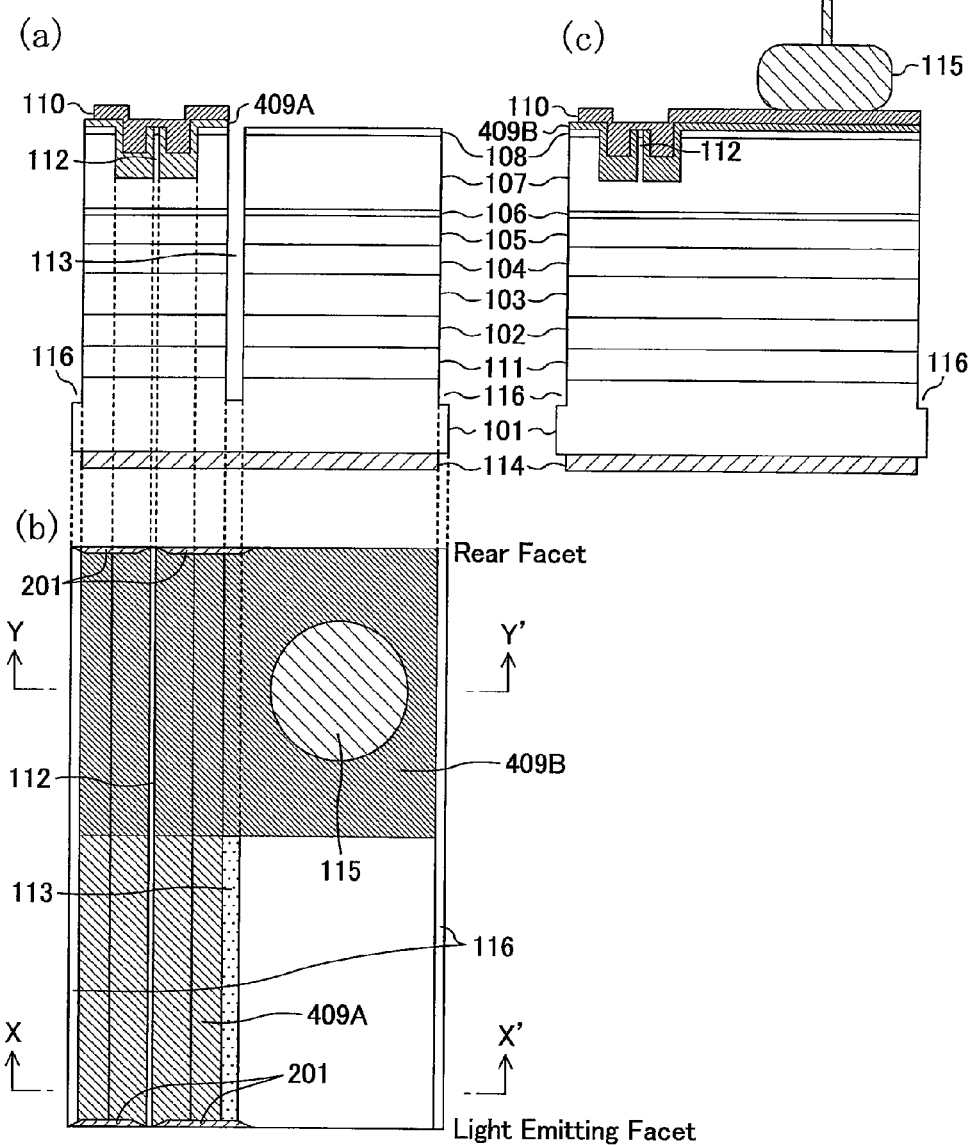
FIG. 7 is a diagram showing a semiconductor laser apparatus according to a second variation of the first embodiment of the present disclosure, where (a) and (c) are cross-sectional views showing a structure of the semiconductor laser apparatus, and (b) is a top view showing the structure of the semiconductor laser apparatus.
Figure 8:
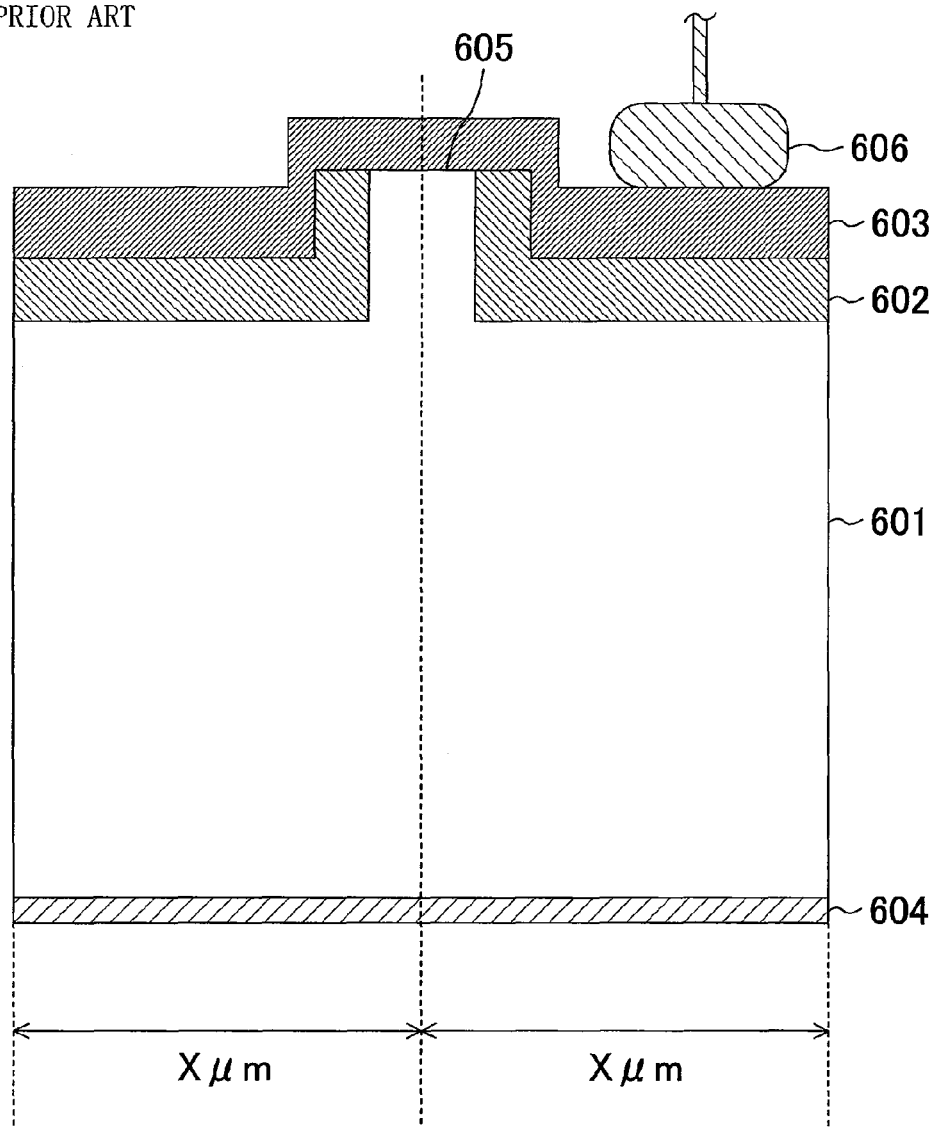
FIG. 8 is a cross-sectional view of a conventional semiconductor laser apparatus.
Figure 9A:
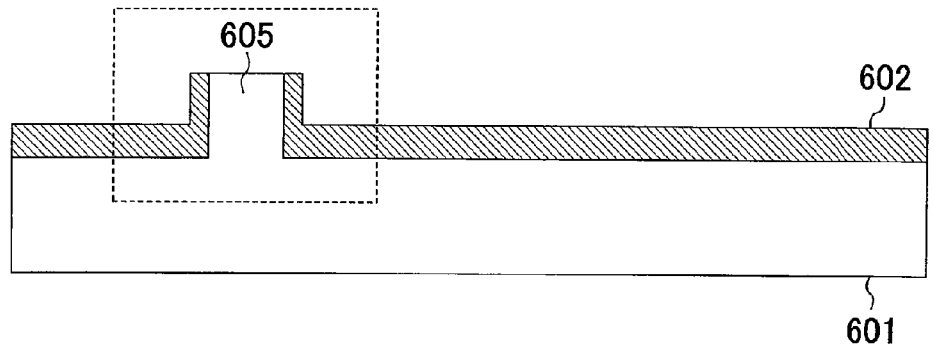
FIG. 9A is a cross-sectional view schematically showing a semiconductor laser apparatus having an asymmetric structure in which regions on the left and right sides of a ridge have different widths.
Figure 9B:
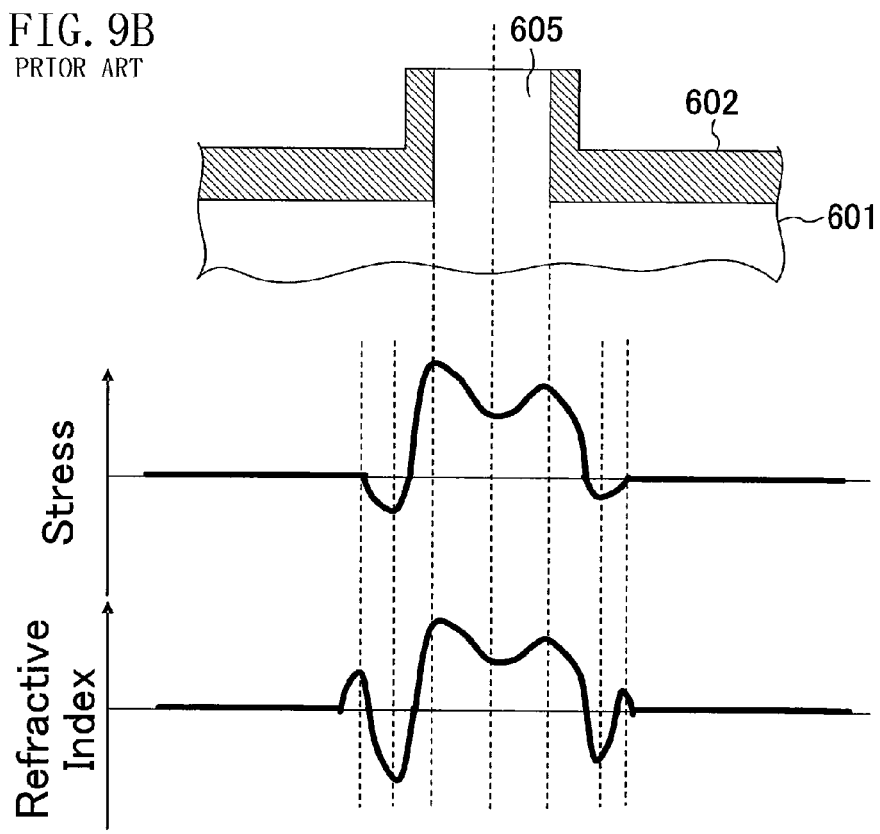
FIG. 9B is an enlarged cross-sectional view of a vicinity of the ridge, accompanied by graphs showing a distribution of stresses applied to the vicinity of the ridge and a distribution of refractive indices of the vicinity of the ridge, in the semiconductor laser apparatus of FIG. 9A.

FIG. 7 is a diagram showing the semiconductor laser apparatus of the second variation of the first embodiment, where (a) and (c) are cross-sectional views showing a structure of the semiconductor laser apparatus, and (b) is a top view showing the structure of the semiconductor laser apparatus. Here, (a) and (c) of FIG. 7 are cross-sectional views, taken along lines X-X' and Y-Y' of (b) of FIG. 7, respectively. Note that, in (a)-(c) of FIG. 7, the same components as those of (a) and (b) of FIG. 1 are indicated by the same reference characters and the same description will not be repeated.

As shown in (a)-(c) of FIG. 7, in the semiconductor laser apparatus of this variation, as in the first variation of the first embodiment, a trench 113 which extends from an upper surface of a p-type contact layer 108 and reaches the inside of a substrate 101 is formed along a resonator length direction (optical waveguide direction) from a light emitting facet to a center portion of a resonator. A wire 115 is coupled to a region extending from the center portion of the resonator to a rear facet. Moreover, the trench 113 is provided in a region having a greater distance between a center position of the ridge 112 and a chip end, and a distance between the center position of the ridge 112 and the trench 113 in the region is substantially the same as a width of a region having a smaller distance between the center position of the ridge 112 and a chip end. Moreover, a cleavage guide trench 201 is provided in each of the light emitting facet and the rear facet.

A feature of this variation in which it is different from the first variation of the first embodiment is that, as shown in (a)-(c) of FIG. 7, a current blocking layer 409A formed from the light emitting facet to the center portion of the resonator and a current blocking layer 409B formed from the center portion of the resonator to the rear facet are formed of different materials.

In this variation, as viewed in the resonator length direction, the widths (the widths of portions substantially functioning as cladding layers) of the cladding layers 102 and 107 made of AlGaN (AlGaN cladding layers) with respect to the ridge 112 differ between a region where the trench 113 is formed (first-half portion) and a region where the trench 113 is not formed (second-half portion). Therefore, the stress applied to the ridge 112 differs between the first-half portion and the second-half portion. Specifically, in the first-half portion, the width of the AlGaN cladding layer is reduced by the presence of the trench 113, and therefore, the stress in the AlGaN cladding layer is reduced. On the other hand, in the second-half portion, the distance between the position of the ridge 112 and the center of the chip is greater, and therefore, the stress in the AlGaN cladding layer is larger, so that the refractive index distribution varies in the resonator length direction.

Moreover, in this variation, the trench 113 is formed deeper than the AlGaN cladding layer, and therefore, in the first-half portion in which the trench 113 is formed, the center position of the chip is substantially the same as the center position between the trench 113 and a chip end (one which is closer to the ridge 112 as viewed from the trench 113). Specifically, in the first-half portion in which the trench 113 is formed, the chip width is substantially narrower, and therefore, the stress caused by the lattice constant difference between AlGaN of the cladding layers 102 and 107 and GaN of the substrate 101 can be reduced.

Specifically, in this variation, the current blocking layer 409A in the first-half portion in the resonator length direction in which the trench 113 is formed is made of $SiO_2$, and the current blocking layer 409B in the second-half portion in the resonator length direction in which the trench 113 is not formed is made of $ZrO_2$. Note that, in the top view of (b) of FIG. 7, in order to show regions in which the current blocking layers 409A and 409B are deposited, a positive electrode 110 which is formed on the current blocking layers 409A and 409B is not shown.

Here, the thermal expansion coefficients of GaN, $SiO_2$ and $ZrO_2$ are $5.6 \times 10^{-6}$, $(0.6 \text{ to } 0.9) \times 10^{-6}$ and $(8.0 \text{ to } 11.5) \times 10^{-6}$, respectively. Moreover, if the thermal expansion coefficient of the material for the block layer is greater than that of GaN which is the material for the semiconductor layer, a compressive stress is applied to the inside of the semiconductor layer. Conversely, if the thermal expansion coefficient of the block layer material is smaller, a tensile stress is applied to the inside of the semiconductor layer.

In this variation, this property is utilized so that $SiO_2$ is used as the material for the current blocking layer 409A in the first-half portion in which the stress in the semiconductor layer is small (the first-half portion in the resonator length direction in which the trench 113 is formed) and $ZrO_2$ is used as the material for the current blocking layer 409B in the second-half portion in which the stress in the semiconductor layer is large (the second-half portion in the resonator length direction in which the trench 113 is not formed). As a result, the change in the stress between the first-half portion and the second-half portion in the resonator length direction is reduced, and the asymmetry of the stress distributions in the regions on the left and right sides of the ridge 112 is improved.

As a result, the change in the refractive index can be reduced not only in the lateral direction (transverse direction) of the ridge 112, but also in the resonator length direction. Therefore, the waveguide loss can be further reduced, and the optical axis deviation can be further reduced, resulting in a stable light distribution.

In this variation, $SiO_2$ is used as the material for the current blocking layer 409A in the first-half portion in the resonator length direction, and $ZrO_2$ is used as the material for the current blocking layer 409B in the second-half portion in the resonator length direction. Alternatively, an advantage similar to that of this variation can be obtained if $K1<K0<K2$ is established, where K0 is the thermal expansion coefficient of a nitride semiconductor material of the substrate 101 and each semiconductor layer, K1 is the thermal expansion coefficient of the material for the current blocking layer 409A, and K2 is the thermal expansion coefficient of the material for the current blocking layer 409B.

Moreover, in this variation, the current blocking layer 409A is formed "from the light emitting facet to the center portion of the resonator," and the current blocking layer 409B is formed "from the center portion of the resonator to the rear facet." The present disclosure is not limited to this. An advantage similar to that of this variation can be obtained if the current blocking layer 409A is formed in a region where the trench 113 is formed and the current blocking layer 409B is formed in a region where the trench 113 is not formed.

What is claimed is:

1. A semiconductor laser apparatus comprising:
   a substrate;
   a first-conductivity type layer formed on the substrate;
   an active layer formed on the first-conductivity type layer;
   a second-conductivity type layer formed on the active layer and having a ridge extending along an optical waveguide direction; and
   a current blocking layer formed on the second-conductivity type layer on sides of the ridge,
   wherein
   the ridge is disposed to separate the substrate into a first region having a first width, and a second region having a second width greater than the first width, in a direction perpendicular to the optical waveguide direction,
   the second-conductivity type layer further has a shock attenuating portion having a height greater than or equal to a height of the ridge, on sides of the ridge, and
   in the second region, a trench extending from an upper surface of the shock attenuating portion, penetrating at least the active layer, and reaching the first-conductivity type layer, is formed along the optical waveguide direction.

2. The semiconductor laser apparatus of claim 1, wherein the substrate is made of GaN, and
   the first-conductivity type layer and the second-conductivity type layer are made of AlGaN.

3. The semiconductor laser apparatus of claim 1, wherein the trench penetrates the first-conductivity type layer.

4. The semiconductor laser apparatus of claim 1, wherein a distance between the ridge and the trench is substantially the same as the first width.

5. The semiconductor laser apparatus of claim 1, wherein the trench is formed, extending along the optical waveguide direction from a light emitting facet toward a rear facet.

6. The semiconductor laser apparatus of claim 5, wherein the trench is formed, extending along the optical waveguide direction from the light emitting facet to a center portion of a resonator, and a wire is coupled to a portion of the second region extending from the center portion of the resonator to the rear facet.

7. The semiconductor laser apparatus of claim 5, wherein the trench is formed, extending along the optical waveguide direction from the light emitting facet to a center portion of the resonator, a portion of a current blocking layer extending from the light emitting facet to the center portion of the resonator is made of a first material, and a portion of the current blocking layer extending from the center portion of the resonator to the rear facet is made of a second material which is different from the first material.

8. The semiconductor laser apparatus of claim 7, wherein the substrate is made of a nitride semiconductor material, and $K1<K0<K2$ is established, where $K0$ is a thermal expansion coefficient of the nitride semiconductor material, $K1$ is a thermal expansion coefficient of the first material, and $K2$ is a thermal expansion coefficient of the second material.

9. The semiconductor laser apparatus of claim 1, wherein the trench intersects a cleavage guide trench closer to a light emitting facet.

10. The semiconductor laser apparatus of claim 9, wherein $H1<H2$ is established, where $H1$ is a depth of the trench and $H2$ is a depth of the cleavage guide trench.

11. The semiconductor laser apparatus of claim 1, wherein the sum of the first width and the second width is 160 μm or less, and the first width is not less than 30 μm and less than 80 μm.

* * * * *